(12) United States Patent
Hsu et al.

(10) Patent No.: US 10,127,987 B2
(45) Date of Patent: Nov. 13, 2018

(54) METHOD FOR OPERATING SINGLE-POLY NON-VOLATILE MEMORY CELL

(71) Applicant: eMemory Technology Inc., Hsin-Chu (TW)

(72) Inventors: Chia-Jung Hsu, Taoyuan (TW); Wein-Town Sun, Taoyuan (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/834,063

(22) Filed: Dec. 7, 2017

(65) Prior Publication Data
US 2018/0197613 A1 Jul. 12, 2018

Related U.S. Application Data

(60) Provisional application No. 62/444,379, filed on Jan. 10, 2017.

(51) Int. Cl.
*G11C 16/04* (2006.01)
*G11C 16/14* (2006.01)
(Continued)

(52) U.S. Cl.
CPC ............ *G11C 16/14* (2013.01); *G11C 7/04* (2013.01); *G11C 7/109* (2013.01); *G11C 7/1084* (2013.01);
(Continued)

(58) Field of Classification Search
CPC .......... G11C 16/14; G11C 7/04; G11C 7/1084
(Continued)

(56) References Cited

U.S. PATENT DOCUMENTS

4,797,856 A 1/1989 Lee
6,134,150 A 10/2000 Hsu
(Continued)

*Primary Examiner* — Vu Le
(74) *Attorney, Agent, or Firm* — Winston Hsu (57) ABSTRACT

A method for operating a NVM cell is disclosed. The NVM cell includes a select transistor and a floating gate transistor serially connected to the select transistor on an N well. The floating gate transistor includes a floating gate and a floating gate extension capacitively coupled to an erase gate region. The method includes erasing the NVM cell by applying an N well voltage $V_{NW}$ to the N well, wherein $V_{NW}>0V$; applying a source line voltage $V_{SL}$ to a source doping region of the select transistor, wherein $V_{SL}=0V$; applying a word line voltage $V_{WL}$ to a select gate of the select transistor, wherein $V_{WL}=0V$; applying a bit line voltage $V_{BL}$ to a drain doping region of the floating gate transistor, wherein $V_{BL}=0V$; and applying an erase line voltage $V_{EL}$ to the erase gate region, wherein $V_{EL}=V_{EE}$.

10 Claims, 5 Drawing Sheets

(51) Int. Cl.
| | |
|---|---|
| H03K 19/088 | (2006.01) |
| H01L 27/11541 | (2017.01) |
| G11C 7/04 | (2006.01) |
| G11C 7/10 | (2006.01) |
| G11C 16/12 | (2006.01) |
| H01L 27/11558 | (2017.01) |
| H01L 29/423 | (2006.01) |
| G11C 16/26 | (2006.01) |
| H01L 27/11524 | (2017.01) |
| G11C 16/34 | (2006.01) |
| H01L 29/78 | (2006.01) |
| H03K 17/082 | (2006.01) |
| H01L 29/788 | (2006.01) |

(52) U.S. Cl.
CPC ...... *G11C 16/0433* (2013.01); *G11C 16/0441* (2013.01); *G11C 16/12* (2013.01); *G11C 16/26* (2013.01); *G11C 16/3472* (2013.01); *H01L 27/11524* (2013.01); *H01L 27/11541* (2013.01); *H01L 27/11558* (2013.01); *H01L 29/42328* (2013.01); *H01L 29/7841* (2013.01); *H03K 19/088* (2013.01); *H01L 29/42364* (2013.01); *H01L 29/7883* (2013.01); *H03K 17/0828* (2013.01)

(58) Field of Classification Search
USPC .......................... 365/185.29, 185.3, 185.26
See application file for complete search history.

(56) References Cited

U.S. PATENT DOCUMENTS

| | | | |
|---|---|---|---|
| 7,099,192 B2 | 8/2006 | Wang | |
| 8,941,167 B2 | 1/2015 | Chen | |
| 2005/0199936 A1* | 9/2005 | Wang | ................ G11C 16/0433 257/314 |
| 2008/0291728 A1* | 11/2008 | Terzioglu | ........... G11C 16/0425 365/185.08 |
| 2011/0233643 A1* | 9/2011 | Chang | ............... G11C 16/0425 257/319 |

* cited by examiner

METHOD FOR OPERATING SINGLE-POLY NON-VOLATILE MEMORY CELL

CROSS REFERENCE TO RELATED APPLICATIONS

This application claims the benefit of U.S. provisional application No. 62/444,379 filed Jan. 10, 2017.

BACKGROUND OF THE INVENTION

1. Field of the Invention

The present invention relates to a method for operating a nonvolatile memory cell. More specifically, the present invention relates to a self-limiting or bit-by-bit self-saturated method for erasing a single-poly, floating gate based non-volatile memory (NVM) cell with an erase gate region.

2. Description of the Prior Art

Semiconductor memory devices have become more popular for use in various electronic devices. For example, non-volatile memory (NVM) is widely used in cellular telephones, digital cameras, personal digital assistants, mobile computing devices, and other applications.

Generally, NVM may be divided into multi-time programmable (MTP) memory and one-time programmable (OTP) memory. MTP memory is multi-readable and multi-writable. For example, electrically programmable and electrically erasable read-only memory (EEPROM) and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC).

As known in the art, electrical charge is transferred into the floating gate using a variety of techniques such as avalanche injection, channel injection, Fowler-Nordheim tunneling, channel hot electron injection, etc. The floating gate is programmed when a charge is stored in the floating gate. The cell is in an unprogrammed, or erased, state when the floating gate is discharged. The charge can be removed from the floating gate by an erase operation.

One problem with the single-poly NVM is over-erasure, which may lead to hard errors such as stuck bits, and may result in program failure. To avoid over-erasure of the memory cells, a more stressed soft-program mode is typically used. However, this may cause fly bits and make the disturbance worse.

SUMMARY OF THE INVENTION

It is one object of the invention to provide a self-limiting or bit-by-bit self-saturated method for erasing a single-poly non-volatile memory (NVM) cell with an erase gate region in order to avoid the over erase phenomenon.

According to one aspect of the invention, a method for operating a single-poly non-volatile memory (NVM) cell is disclosed. The single-poly NVM cell comprises a PMOS select transistor and a PMOS floating gate transistor serially connected to the PMOS select transistor on an N well, wherein the PMOS floating gate transistor comprises a floating gate and a floating gate extension capacitively coupled to an erase gate (EG) region.

The method includes erasing the single-poly NVM cell by applying an N well voltage $V_{NW}$ to the N well, wherein $V_{NW}>0V$; applying a source line voltage $V_{SL}$ to a $P^+$ source doping region of the select transistor, wherein $V_{SL}=0V$; applying a word line voltage $V_{WL}$ to a select gate of the select transistor, wherein $V_{WL}=0V$; applying a bit line voltage $V_{BL}$ to a $P^+$ drain doping region of the floating gate transistor, wherein $V_{BL}=0V$; and applying an erase line voltage $V_{EL}$ to the EG region, wherein $V_{EL}=V_{EE}$, and wherein $V_{EE}$ is a positive voltage that is high relative to $V_{BL}$.

When the floating gate is in a programmed state, $V_{NW}$ applied to the N well is lower than a drain-to-source saturation voltage $V_{DS-Sat}$ to ensure that pinchoff does not occur at two ends of a P channel under the floating gate at the beginning of the erasing operation, while the floating gate is in an erased state, $V_{NW}$ applied to the N well is higher than $V_{DS-Sat}$ to ensure that pinchoff occurs at two ends of the P channel.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations or process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

Figure 1:
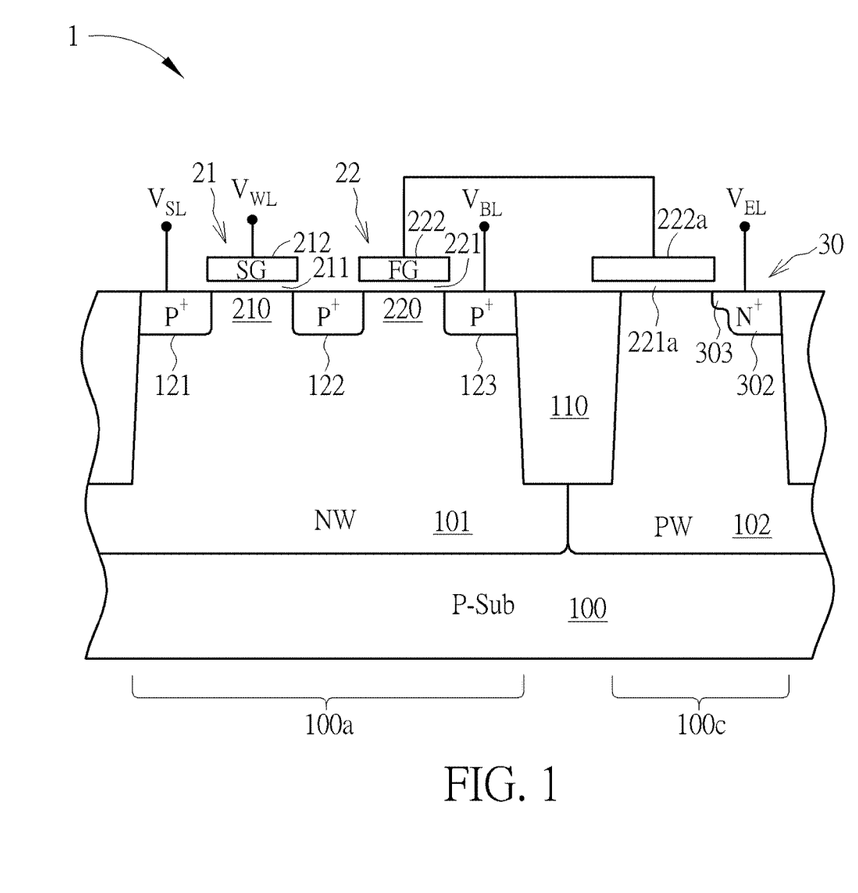
FIG. 1 is a schematic diagram showing an exemplary single-poly nonvolatile memory cell in accordance with one embodiment of this invention.

FIG. 1 is a schematic, cross-sectional view showing an exemplary single-poly nonvolatile memory (NVM) cell in accordance with one embodiment of this invention. As shown in FIG. 1, the NVM cell 1 comprises a select transistor 21 and a floating gate transistor 22 that is serially connected to the select transistor 21. The serially connected select transistor 21 and the floating gate transistor 22 may be formed directly on the same OD region 100a. An N well (NW) 101 is provided in the semiconductor substrate 100 such as a P type silicon substrate (P-Sub). The N well 101 encompasses the OD region 100a such that the select transistor 21 and the floating gate transistor 22 are disposed on the N well 101. During operation, the N well 101 is provided with an N well voltage ($V_{NW}$).

According to the illustrative embodiment, the select transistor 21 comprises a source doping region 121 in the N well 101, a common doping region 122 spaced apart from the source doping region 121, a select gate channel region 210 near the main surface of the semiconductor substrate 100 between the source doping region 121 and the common doping region 122, a select gate (SG) 212 overlying the select gate channel region 210, and a gate dielectric layer 211 between the select gate 212 and the select gate channel region 210. The select gate (SG) 212 is coupled to a word line voltage ($V_{WL}$).

According to the illustrative embodiment, the select transistor 21 may be a PMOS transistor and the select gate (SG) 212 may be a $P^+$ doped polysilicon gate, but is not limited thereto. The source doping region 121 and the common doping region 122 may be $P^+$ doping regions. According to the illustrative embodiment, the source doping region 121 maybe electrically coupled to a source line voltage ($V_{SL}$).

Although not shown in the figures, it is understood that sidewall spacers may be formed on opposite sidewalls of the select gate 212 and lightly doped drain (LDD) regions maybe formed directly under the spacers. Although not shown in the figures, it is understood that in some embodiments the source doping region 121 and the common doping region 122 may comprise the LDD regions such as PLDD regions.

The floating gate transistor 22 is formed directly on the OD region 100a. The floating gate transistor 22 is serially coupled to the select transistor 21 through the common doping region 122. The common doping region 122 is shared by the floating gate transistor 22 and the select transistor 21, thereby forming two serially connected transistors 21 and 22, and in this illustrative case, two serially connected PMOS transistors.

The floating gate transistor 22 comprises a floating gate (FG) 222 overlying the OD region 100a. According to the illustrative embodiment, the floating gate 222 consists of a single layer of polysilicon, for example, $P^+$ doped polysilicon. According to the illustrative embodiment, the floating gate 222 is a single-poly gate. That is, no additional gate layer is stacked on the floating gate 222. According to the illustrative embodiment, the floating gate transistor 22 serves as the charge storage element of the NVM cell 1.

The floating gate transistor 22 further comprises the common doping region 122 on one side of the floating gate (FG) 222, a drain doping region 123 on the other side of the floating gate 222 that is opposite to the common doping region 122, a floating gate channel region 220 between the common doping region 122 and the drain doping region 123, and a gate dielectric layer 221 between the floating gate 222 and the floating gate channel region 220. Although not shown in the figures, it is understood that sidewall spacers may be formed on opposite sidewalls of the floating gate 222. According to the illustrative embodiment, the drain doping region 123 may be a $P^+$ doping region and is electrically coupled to a bit line voltage ($V_{BL}$).

According to the illustrative embodiment, the NVM cell 1 further comprises a floating gate extension 222a continuously extending from the floating gate 222 to an OD region 100c and is adjacent to an erase gate (EG) region 30, which is coupled to an erase line voltage ($V_{EL}$). The floating gate extension 222a traverses the trench isolation region 110 between the OD region 100a and the OD region 100c and partially overlaps with the OD region 100c so as to capacitively couple to the EG region 30. A P well (PW) 102 may be provided in the semiconductor substrate 100. The P well 102 encompasses the OD region 100c. During operation, the P well 101 is provided with a P well voltage ($V_{PW}$).

The EG region 30 may comprise a heavily doped region 302 such as an $N^+$ doping region adjacent to the floating gate extension 222a. A lightly doped drain (LDD) region 303 such as an NLDD may be disposed in the semiconductor substrate 100 and may be situated directly under the spacer. The LDD region 303 is contiguous with the heavily doped region 302.

According to the illustrative embodiment, a gate dielectric layer 221a may be formed between the floating gate extension 222a and the semiconductor substrate 100. According to the illustrative embodiment, the heavily doped region 302 is formed in an area that is not covered by the floating gate extension 222a. In operation, such as an erase operation, the heavily doped region 302 is electrically coupled to the erase line voltage ($V_{EL}$).

According to the illustrative embodiment, the erasing operation for the PMOS-type NVM cell 1 involves a tunneling mechanism that removes electrons from the cell's floating gate 222 via the floating gate extension 222a.

For example, during an erasing operation for the NVM cell 1, the source line voltage $V_{SL}$ provided to the source doping region 121 of the select transistor 21 is 0V ($V_{SL}$=0V), and the word line voltage (or select gate voltage) $V_{WL}$ provided to the select gate 212 of the select transistor 21 is also 0V ($V_{WL}$=0V). The bit line voltage $V_{BL}$ is 0V ($V_{BL}$=0V). The erase line voltage $V_{EL}$ is equal to a positive, high voltage $V_{EE}$ ($V_{EL}$=$V_{EE}$) that may range approximately between 12~20V. The N well voltage $V_{NW}$ is greater than 0V, which may range approximately between 1~3V ($V_{NW}$=1~3V), for example, 2V. The P well voltage $V_{PW}$ is 0V ($V_{PW}$=0V). A substrate voltage $V_{P-Sub}$ is applied to the semiconductor substrate 100, wherein $V_{P-Sub}$=0V.

Figure 2:
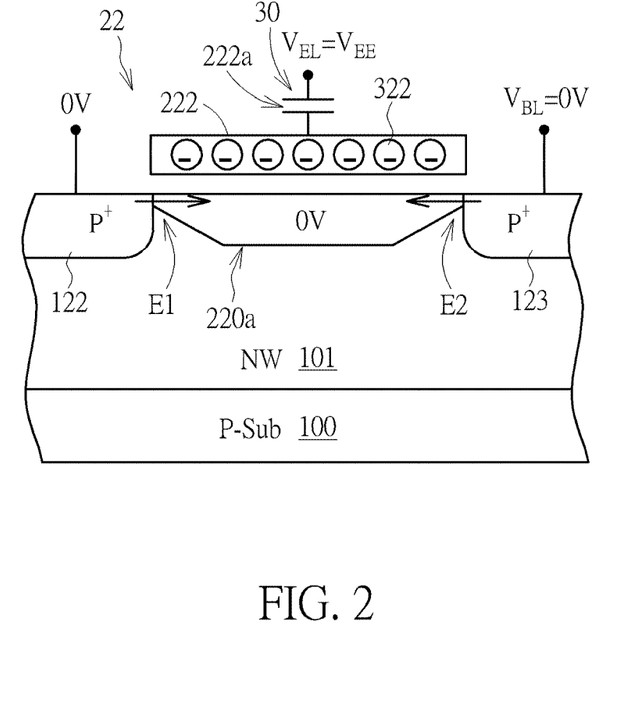
FIG. 2 schematically shows that the floating gate transistor in a programmed state and is just started to be erased.
Figure 3:
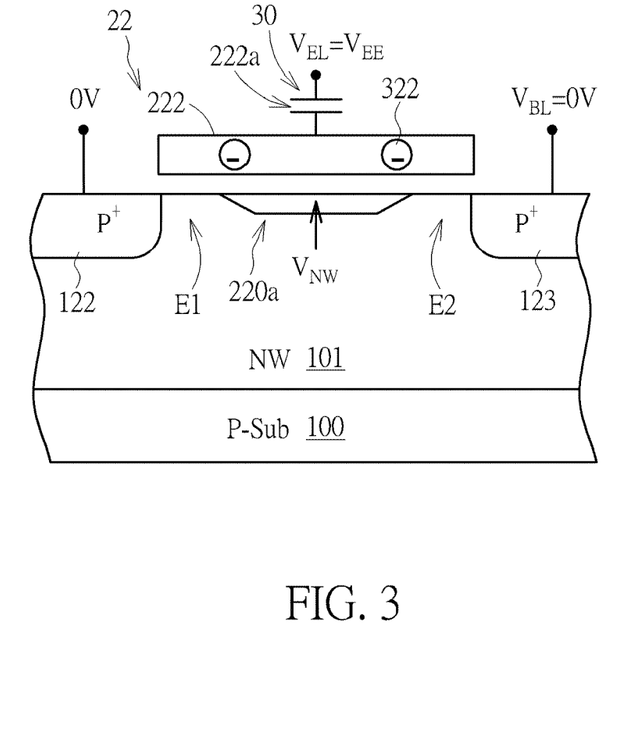
FIG. 3 schematically shows the floating gate transistor in an erased state.

This erase technique may be better understood with reference to the FIG. 2 and FIG. 3, wherein only a portion of the NVM cell 1 is shown for the sake of simplicity. FIG.

2 schematically shows that the floating gate transistor 22 in a programmed state and is just started to be erased. FIG. 3 schematically shows the floating gate transistor 22 in an erased state.

As shown in FIG. 2, at an early stage of the erase operation, a P channel 220a underneath the floating gate 222 is formed and two opposite ends $E_1$ and $E_2$ of the P channel 220a are contiguous with the common doping region 122 and the drain doping region 123, respectively. Since the floating gate 222 is coupled with the P channel 220a (0V), the erase efficiency is relatively high initially. Electrons 322 are removed from the floating gate 222 via the floating gate extension 222a rapidly at the beginning of the erase operation due to higher erase bias condition ($V_{EE}$ to 0V).

As shown in FIG. 3, as the erasing operation continues, the quantity of the electrons 322 in the floating gate 222 decreases and the P channel 220a gradually disappears (or starts to taper or wither) at the two opposite ends $E_1$ and $E_2$ of the P channel 220a, thereby eventually disconnecting the withered P channel 220a with the common doping region 122 and the drain doping region 123, respectively. After this point (when pinch-off occurs), the floating gate 222 is partially coupled to the withered P channel 220a and partially coupled to portions of the N well 101 between the withered P channel 220a and the common doping region 122 and between the withered P channel 220a and the drain doping region 123. This causes decreased erase efficiency due to reduced erase bias condition ($V_{EE}$ to $V_{NW}$), which slows down the erasing operation of the cell 1.

It is advantageous to use the present invention because the erasing operation is self-limiting without the need of modifying the layout of the single-poly NVM cell and the final erase state of each cell in the memory array is convergent to approximately same level and is auto-saturated on a bit-by-bit basis. The problem of over-erasure can be avoided. Further, a less stressed soft program mode can be employed, thereby improving the reliability and enabling lower power supply. Fly bits and disturbance can be avoided due to less stressed soft program mode.

According to one embodiment, for determining an upper limit voltage level and a lower limit voltage level of the N well voltage $V_{NW}$ applied to the N well 101 is described below. for erasing operation of a PMOS memory cell wherein the floating gate is in the programmed state, $V_{NW}$ applied to the N well 101 must be set lower than a first drain-to-source saturation voltage $V_{DS\text{-}Sat1}$ (upper limit voltage level) to ensure that pinchoff does not occur at two ends $E_1$ and $E_2$ of the P channel 220a at the beginning of the erase operation and thus a higher erase efficiency. When the floating gate is in the erased state, $V_{NW}$ applied to the N well 101 must be set higher than a second drain-to-source saturation voltage $V_{DS\text{-}Sat2}$ (lower limit voltage level) to ensure that pinchoff occurs at two ends $E_1$ and $E_2$ of the P channel 220a such that over-erasure can be avoided.

Figure 4:
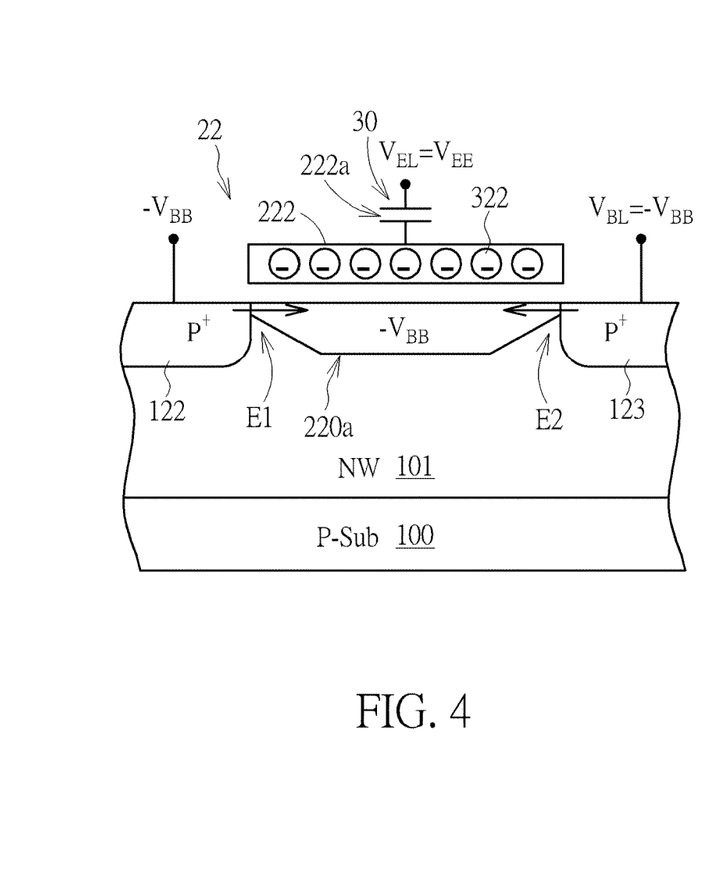
FIG. 4 and FIG. 5 illustrate voltage conditions for the erasing operation of the NVM cell according to another embodiment.
Figure 5:
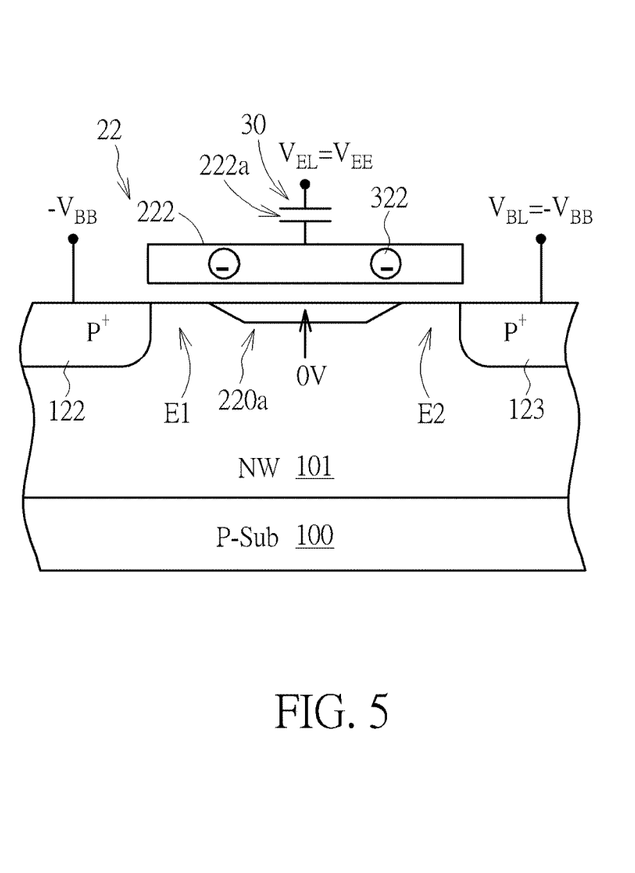

FIG. 4 and FIG. 5 illustrate voltage conditions for the erasing operation of the NVM cell 1 according to another embodiment, wherein only a portion of the NVM cell 1 is shown for the sake of simplicity. Likewise, FIG. 4 schematically shows that the floating gate transistor 22 in a programmed state and is just started to be erased. FIG. 5 schematically shows the floating gate transistor 22 in an erased state.

During an erasing operation for the NVM cell 1, the bit line voltage $V_{BL}$ is a negative voltage, for example, $V_{BL}$=−$V_{BB}$. $V_{BB}$ may range approximately between 1~3V ($V_{BB}$=1~3V).The erase line voltage $V_{EL}$ is equal to a positive, high voltage $V_{EE}$ ($V_{EL}$=$V_{EE}$) that may range approximately between 12~20V. The N well voltage $V_{NW}$ is 0V ($V_{NW}$=0V). The P well voltage $V_{PW}$ is 0V ($V_{PW}$=0V). A substrate voltage $V_{P\text{-}sub}$ is applied to the semiconductor substrate 100, wherein $V_{P\text{-}Sub}$=0V.

As shown in FIG. 4, at an early stage of the erase operation, a P channel 220a underneath the floating gate 222 is formed and two opposite ends $E_1$ and $E_2$ of the P channel 220a are contiguous with the common doping region 122 and the drain doping region 123, respectively. Since the floating gate 222 is completely coupled with the P channel 220a (−$V_{BB}$), the erase efficiency is relatively high initially. Electrons 322 are removed from the floating gate 222 via the floating gate extension 222a rapidly at the beginning of the erase operation due to higher erase bias condition ($V_{EE}$ to −$V_{BB}$).

As shown in FIG. 5, as the erasing operation continues, the quantity of the electrons 322 in the floating gate 222 decreases and the P channel 220a gradually disappears (or starts to taper or wither) at the two opposite ends $E_1$ and $E_2$ of the P channel 220a, thereby eventually disconnecting the withered P channel 220a with the common doping region 122 and the drain doping region 123, respectively. After this point (when pinch-off occurs), the floating gate 222 is coupled to the N well 101 (0V). This causes decreased erase efficiency due to reduced erase bias condition ($V_{EE}$ to 0V), which slows down the erasing operation of the cell 1.

The present invention may be applicable to NMOS-type memory cells. The NMOS-type memory cell may involve a P well 103 under the OD region 100a and a deep N well (DNW) 105 under the P well 103.

Figure 6:
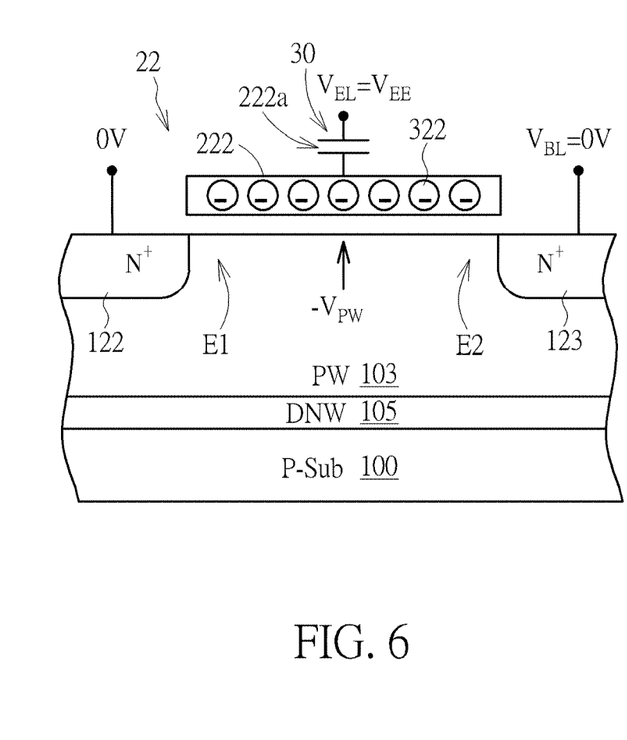
FIG. 6 and FIG. 7 illustrate exemplary voltage conditions for the erasing operation of an NMOS-type NVM cell according to still another embodiment.
Figure 7:
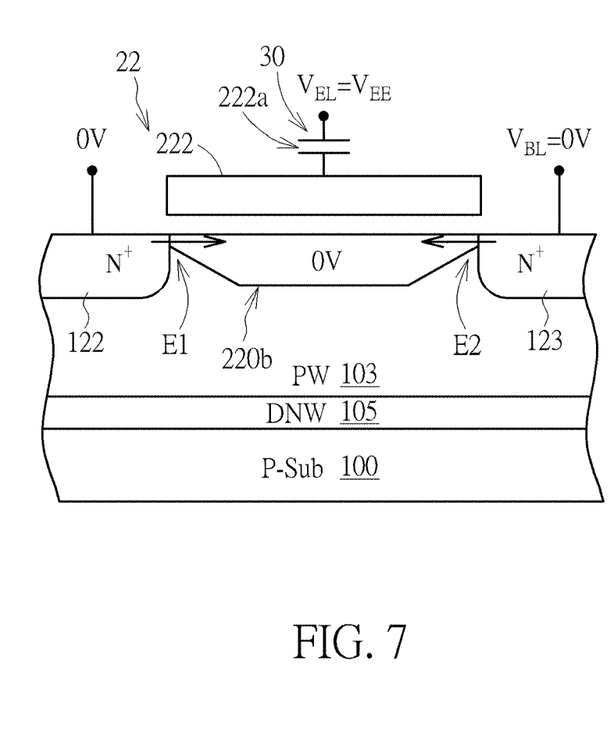

FIG. 6 and FIG. 7 illustrate exemplary voltage conditions for the erasing operation of an NMOS-type NVM cell according to still another embodiment, wherein only a portion of the NMOS-type NVM cell is shown for the sake of simplicity. Likewise, FIG. 6 schematically shows that the floating gate transistor in a programmed state and is just started to be erased. FIG. 7 schematically shows the floating gate transistor in an erased state.

During an erasing operation for the NMOS-type NVM cell, the source line voltage $V_{SL}$ provided to the source doping region 121 of the select transistor 21 is 0V, $V_{SL}$=0V, and the word line voltage (or select gate voltage) $V_{WL}$ provided to the select gate 212 of the select transistor 21 is 0V ($V_{WL}$=0V). The bit line voltage $V_{BL}$ is 0V, $V_{BL}$=0V. The erase line voltage $V_{EL}$ is equal to a positive, high voltage $V_{EE}$ ($V_{EL}$=$V_{EE}$) that may range approximately between 12~20V. The P well voltage $V_{PW}$ applied to the P well 103 is a negative voltage ($V_{PW}$=−$V_{BB}$, which may range approximately between 1~3V ($V_{BB}$=1~3V).

As shown in FIG. 6, at an early stage of the erase operation, the floating gate 222 is completely coupled with the P well voltage $V_{PW}$, the erase efficiency is relatively high initially. Electrons 322 are removed from the floating gate 222 via the floating gate extension 222a rapidly at the beginning of the erase operation due to higher erase bias condition.

As shown in FIG. 7, as the erasing operation continues, the quantity of the electrons 322 in the floating gate 222 decreases and an N channel 220b gradually appears, thereby eventually connecting the common doping region 122 and the drain doping region 123. At this point, the floating gate 222 is coupled to the N channel 220b (0). This causes decreased erase efficiency due to reduced erase bias condition ($V_{EE}$ to 0V), which slows down the erasing operation of the cell.

Figure 8:
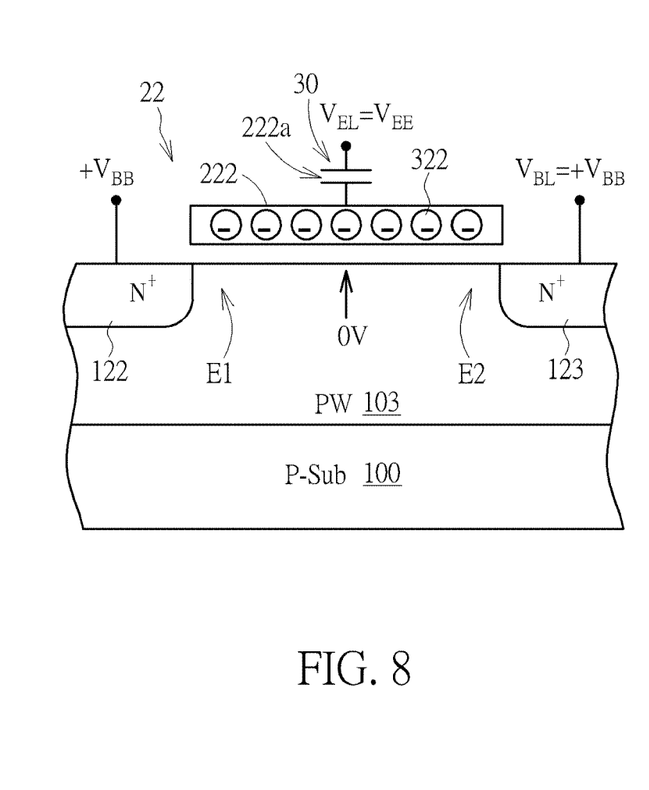
FIG. 8 and FIG. 9 illustrate exemplary voltage conditions for the erasing operation of an NMOS-type NVM cell according to yet another embodiment, wherein a deep N well can be omitted.
Figure 9:
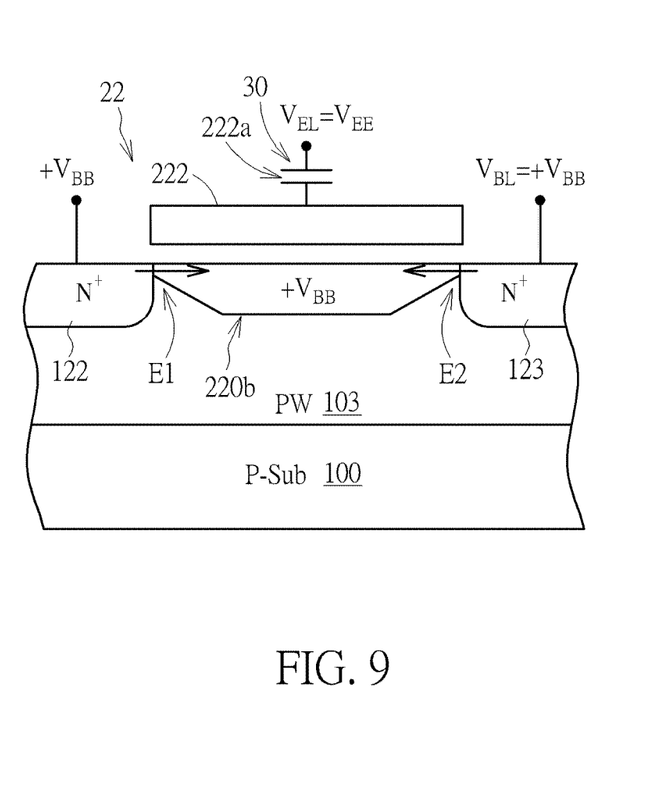

FIG. 8 and FIG. 9 illustrate exemplary voltage conditions for the erasing operation of an NMOS-type NVM cell according to yet another embodiment, wherein a deep N well can be omitted. FIG. 8 schematically shows that the floating gate transistor in a programmed state and is just started to be erased. FIG. 9 schematically shows the floating gate transistor in an erased state.

During an erasing operation for the NMOS-type NVM cell, the bit line voltage $V_{BL}$ is a positive voltage, $V_{BL}=+V_{BB}$. $V_{BB}$ may range approximately between 1~3V ($V_{BB}=1$~3V). The erase line voltage $V_{EL}$ is equal to a positive, high voltage $V_{EE}$ ($V_{EL}=V_{EE}$) that may range approximately between 12~20V. The P well voltage $V_{PW}$ applied to the P well 103 is 0V ($V_{PW}=0$V). According to this embodiment, a deep N well may be omitted.

As shown in FIG. 8, at an early stage of the erase operation, the floating gate 222 is completely coupled with the P well voltage $V_{PW}$, the erase efficiency is relatively high initially. Electrons 322 are removed from the floating gate 222 via the floating gate extension 222a rapidly at the beginning of the erase operation due to higher erase bias condition.

As shown in FIG. 9, as the erasing operation continues, the quantity of the electrons 322 in the floating gate 222 decreases and an N channel 220b gradually appears, thereby eventually connecting the common doping region 122 and the drain doping region 123. At this point, the floating gate 222 is coupled to the N channel 220b (+$V_{BB}$). This causes decreased erase efficiency due to reduced erase bias condition ($V_{EE}$ to +$V_{BB}$), which slows down the erasing operation of the cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a single-poly non-volatile memory (NVM) cell, wherein the single-poly NVM cell comprises a PMOS select transistor and a PMOS floating gate transistor serially connected to the PMOS select transistor on an N well, wherein the PMOS floating gate transistor comprises a floating gate and a floating gate extension, wherein the floating gate extension is capacitively coupled to an erase gate (EG) region, the method comprising:

erasing the single-poly NVM cell by applying a bit line voltage to a P$^+$ drain doping region of the floating gate transistor, applying an erase line voltage to the EG region, and applying an N well voltage to the N well;

wherein the bit line voltage is equal to 0V, the erase line voltage is equal to a positive voltage that is high relative to the bit line voltage; and wherein the N well voltage is greater than 0V and is in a range between a first drain-to-source saturation voltage $V_{DS\text{-}Sat1}$ and a second drain-to-source saturation voltage $V_{DS\text{-}Sat2}$, wherein the first drain-to-source saturation voltage $V_{DS\text{-}Sat1}$ is an upper limit voltage level to ensure that pinchoff does not occur at two ends of a P channel under the floating gate at the beginning of the erasing operation, while the second drain-to-source saturation voltage $V_{DS\text{-}Sat2}$ is a lower limit voltage level to ensure that pinchoff occurs at two ends of the P channel when the floating gate is in an erased state.

2. The method according to claim 1, wherein the method further comprises applying a source line voltage to a P$^+$ source doping region of the select transistor; applying a word line voltage to a select gate of the select transistor, wherein the source line voltage and the word line voltage are equal to 0V.

3. The method according to claim 1, wherein the single-poly NVM cell comprises a first oxide define (OD) region in a semiconductor substrate, a second oxide define (OD) region, wherein the EG region is disposed in the second OD region.

4. The method according to claim 3, wherein the semiconductor substrate is a P type silicon substrate and the EG region is disposed in a P well, and wherein the EG region comprises a heavily doped region in the P well and adjacent to the floating gate extension.

5. The method according to claim 4, wherein the heavily doped region is an N$^+$ doped region.

6. The method according to claim 4 further comprising:
   applying a P well voltage to the P well; and
   applying a substrate voltage to the semiconductor substrate, wherein the P well voltage and the substrate voltage are equal to 0V.

7. The method according to claim 3, wherein the single-poly NVM cell further comprises a trench isolation region separating the first OD region from the second OD region.

8. The method according to claim 7, wherein the select transistor and the floating gate transistor are disposed on the first OD region, and wherein the select transistor is serially connected to the floating gate transistor through a P$^+$ common doping region.

9. The method according to claim 1, wherein the erase line voltage ranges between approximately 12-20V.

10. The method according to claim 1, wherein the N well voltage ranges between approximately 1-3V.

* * * * *